(12) United States Patent
Sakamoto et al.

(10) Patent No.: US 6,183,917 B1
(45) Date of Patent: Feb. 6, 2001

(54) COLOR FILTER, PRODUCTION PROCESS OF COLOR FILTER, LIQUID CRYSTAL DISPLAY DEVICE USING THE COLOR FILTER, AND PRODUCTION PROCESS OF BLACK MATRIX

(75) Inventors: Junichi Sakamoto, Yokohama; Nagato Osano, Kawasaki; Kenichi Iwata, Tokyo, all of (JP)

(73) Assignee: Canon Kabushiki Kaisha, Tokyo (JP)

( * ) Notice: Under 35 U.S.C. 154(b), the term of this patent shall be extended for 0 days.

(21) Appl. No.: 09/361,807

(22) Filed: Jul. 27, 1999

(30) Foreign Application Priority Data

Jul. 31, 1998 (JP) .................................................. 10-217468

(51) Int. Cl.⁷ .............................. G02B 5/20; G02F 1/1335
(52) U.S. Cl. ................................ 430/7; 349/106; 349/110
(58) Field of Search ................................ 430/7; 349/106, 349/110

(56) References Cited

U.S. PATENT DOCUMENTS

| 5,558,927 | * | 9/1996 | Aruga et al. | 428/195 |
|---|---|---|---|---|
| 5,696,568 | * | 12/1997 | Yamamoto et al. | 349/136 |
| 5,817,441 | | 10/1998 | Iwata et al. | 430/7 |
| 5,888,679 | | 3/1999 | Suzuki et al. | 430/7 |
| 5,914,206 | * | 6/1999 | Takasaki et al. | 430/7 |
| 6,001,533 | * | 12/1999 | Sega et al. | 430/270.1 |

FOREIGN PATENT DOCUMENTS

| 715 203 | 6/1996 | (EP) . |
|---|---|---|
| 724 169 | 7/1996 | (EP) . |
| 7-191462 | 7/1995 | (JP) . |
| 248412 | 9/1995 | (JP) . |
| 7-248412 | 9/1995 | (JP) . |
| 166507 | 6/1996 | (JP) . |
| 113721 | 5/1997 | (JP) . |
| 9-325494 | 12/1997 | (JP) . |
| 10-171119 | 6/1998 | (JP) . |
| 10-213908 | * | 8/1998 | (JP) . |

* cited by examiner

Primary Examiner—John A. McPherson
(74) Attorney, Agent, or Firm—Fitzpatrick, Cella, Harper & Scinto

(57) ABSTRACT

Disclosed herein is a color filter comprising, on its substrate, a resinous black matrix and colored portions provided between elements of the resinous black matrix, wherein an angle formed between a side of each element of the resinous black matrix and the substrate is 70 to 88°.

11 Claims, 3 Drawing Sheets

COLOR FILTER, PRODUCTION PROCESS OF COLOR FILTER, LIQUID CRYSTAL DISPLAY DEVICE USING THE COLOR FILTER, AND PRODUCTION PROCESS OF BLACK MATRIX

BACKGROUND OF THE INVENTION

1. Field of the Invention

The present invention relates to a color filter applicable to color liquid crystal display devices used in color televisions, personal computers, navigation systems for automobile, etc., a production process thereof, a liquid crystal display device using this color filter and a process for the production of black matrix.

2. Related Background Art

A black matrix called a light-screening film has heretofore been incorporated in a color filter for liquid crystal display device for the purpose of preventing color mixing between R (red), G (green) and B (blue) colors and enhancing contrast. The black matrix has heretofore been formed by patterning a film of a metal such as chromium using a photolithographic process. The black matrix formed by using this process has a high reflectance. Therefore, a color filter in which such a black matrix has been incorporated is high in light reflectance and a problem has hence arisen as to the visibility of images.

It has therefore been proposed to realize low reflecting property by sandwiching a metal chromium film between oxide layers such as chromium oxide films. A black matrix formed by such metal and metal compound has had merits that it is high in absorption constant against visible rays, thin in film thickness and high in optical density.

In view of environmental problems in recent years, however, chromium has not only have a possibility that it may change to chromium (VI) injurious to the human body, but also involved a problem that a heavy metal-containing oxidizing agent such as ammonium cerium (IV) nitrate must be used.

In order to solve these problems, resinous black matrix materials of the negative black resist type have been proposed in recent years. Such a black resist may be developed with a dilute solution of alkali such as sodium carbonate and has no possibility that it may change to a substance injurious to the human body when it is left to stand in the natural world.

As the resinous black matrix material, there is generally used that obtained by dispersing a black pigment such as carbon black having a particle diameter of 0.2 $\mu$m or smaller in an alkali-soluble type negative resist. Since this resinous black matrix contains the black pigment, light energy does not reach the lower part of the resist material upon exposure to light. Accordingly, a photo-set portion by the exposure is limited to a surface layer portion of the resist layer. Therefore, the whole resist layer is set by a heat treatment or the like after development.

The resinous black matrix is lower in absorption coefficient compared with the metallic black matrix, and so the film thickness must be thickened in order to obtain the prescribed optical density. When the film thickness is thickened, however, the sectional form of the black matrix has not become an ideal rectangle in some cases as illustrated in FIGS. 4 and 5. These drawings each illustrate the sectional form of a black matrix right after development. In the drawings, reference numeral 1 indicates a transparent substrate, 2a is an unset portion of a black resist layer, and 2b is a set portion of the black resist layer. FIG. 4 shows a case where side etching has occurred at the unset portion 2a upon the development, while FIG. 5 shows a case where the set portion 2b formed in a reverse-tapered shape by the side etching at the unset portion 2a has become fragile and chipped.

When the sectional form becomes such a form as illustrated in FIG. 4 or 5, the optical path length of light transmitted through the edge portion of the black matrix becomes shorter than that of light transmitted through a portion having the prescribed thickness. Therefore, such light is not fully absorbed in the black matrix. Accordingly, in a color filter formed by using such a black matrix, the edges of the black matrix blur, and disadvantages such as lowering of contrast and the occurrence of blank areas in color pixels arise.

When the set portion 2b weakened by the occurrence of the side etching chips in a subsequent step, the chipped set portion forms the cause of generation of dust or particles.

In order to solve such a problem, Japanese Patent Application Laid-Open No. 7-248412 discloses a two-layer film composed of a black resist and a chromium film. In this method, after the black resist is exposed to light, the chromium film is formed, and thereafter an exposed portion or unexposed portion is developed to lift off the chromium film. A black matrix in a reverse-tapered shape may be formed according to the conditions of the development, and moreover the chromium film formed on the set portion can also prevent the set portion from chipping to generate dust. In addition, even when the black matrix is formed in the reverse-tapered shape, disadvantages such as blurring of the edges thereof do not arise because the light-screening property of chromium is high. Since the resist is developed to lift off the chromium film, there is also no need to use an expensive developing solution for directly etching the chromium film.

However, such a method requires an expensive sputtering apparatus for forming the chromium film. In addition, when a chromium oxide film is intended to form by reactive sputtering for the purpose of enhancing the adhesion of the resulting chromium film upon the formation of the chromium film by the sputtering or providing a low-reflective chromium film, it is general to conduct heating. However, such heating is infeasible, since a resist is thermoset by the heating when the resist is formed, and such a chromium film is then formed thereon.

Accordingly, there has been a demand for development of a process for producing a resinous black matrix with good precision at a low cost.

SUMMARY OF THE INVENTION

It is an object of the present invention to provide a color filter having a resinous black matrix which can meet the environmental problems, and being free of blank area and color unevenness, a production process thereof, a liquid crystal display device using this color filter, which permits excellent color display and high contrast and a process for the production of black matrix.

The above object can be achieved by the present invention described below.

According to the present invention, there is thus provided a color filter comprising, on its substrate, a resinous black matrix and colored portions provided between elements of the resinous black matrix, wherein an angle formed between a side of each element of the resinous black matrix and the substrate is 70 to 88°.

According to the present invention, there is also provided a process for producing a black matrix, comprising the steps of applying a black resist onto a substrate, subjecting the black resist to patterning exposure, developing the exposed black resist and subjecting the developed black resist to a rinsing treatment, wherein a pH value, a temperature and an ejection pressure of a developing solution used in the developing step are 10 to 12, 26°C. or lower and 3 MPa or lower, respectively, and a time interval between the termination of feed of the developing solution and the initiation of the rinsing treatment is 2 seconds or shorter.

According to the present invention, there is further provided a process for producing a color filter, comprising the step of applying inks by an ink-jet system to respective regions between elements of the black matrix formed by the production process of the black matrix described above, thereby forming colored portions.

According to the present invention, there is still further provided a liquid crystal display device, comprising the color filter described above, an opposite substrate arranged in an opposing relation to the color filter, and a liquid crystal enclosed in a space between the color filter and the opposite substrate.

DESCRIPTION OF THE PREFERRED EMBODIMENTS

According to the present invention, a black matrix having an ideal sectional form can be produced with high precision by severely limiting development conditions in producing a resinous black matrix using a black resist.

Figure 1:
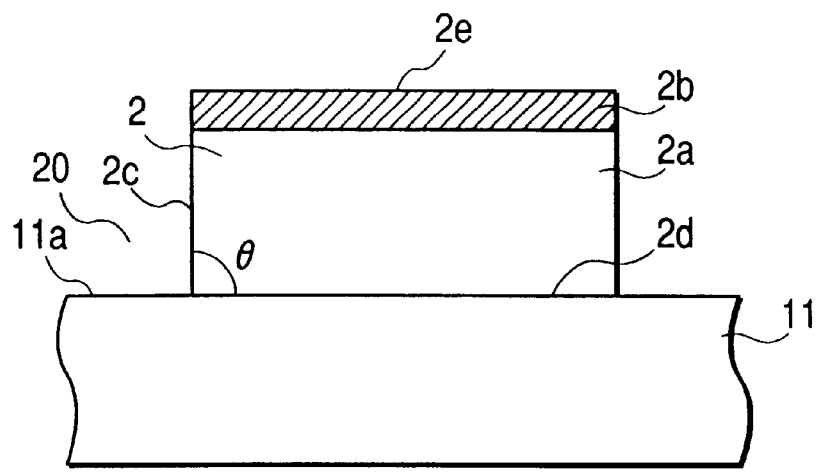
FIG. 1 illustrates an example of a black matrix formed by the production process of a black matrix according to the present invention.
Figure 4:
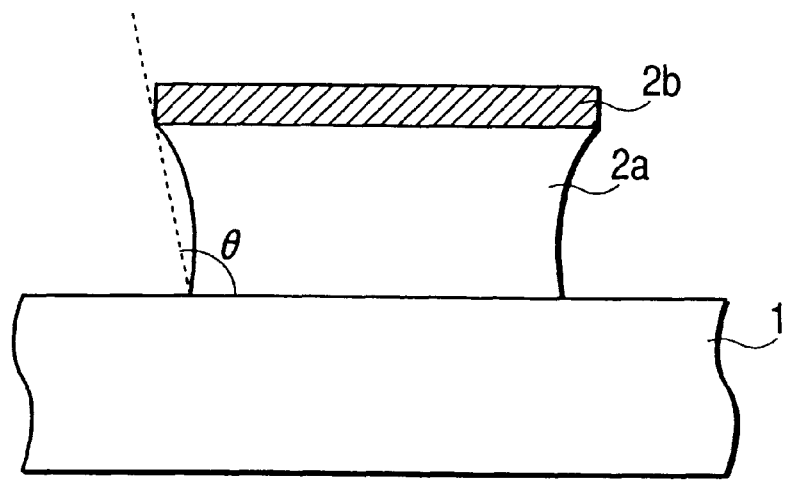
FIG. 4 schematically illustrates an example of a sectional form of a black resist upon the development of the black resist in the conventional production process of a black matrix.
Figure 5:
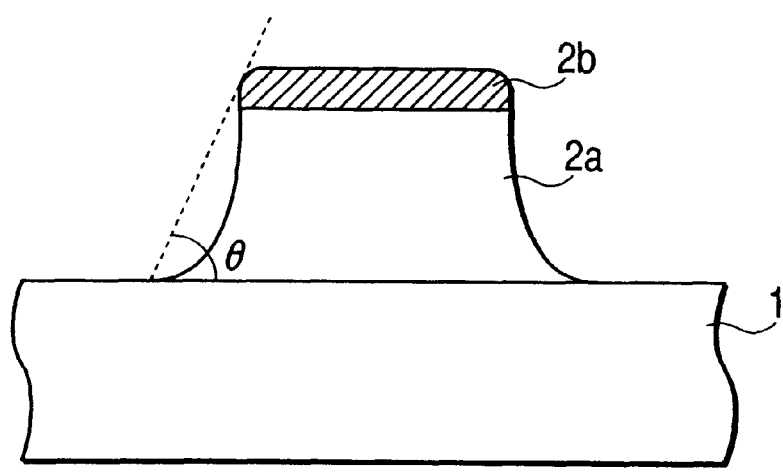
FIG. 5 schematically illustrates another example of a sectional form of a black resist upon the development of the black resist in the conventional production process of a black matrix.

As illustrated in FIG. 1, in the black matrix according to the present invention, an angle θ formed between a side 2c of each element 2 of the black matrix and a surface 11a of a transparent substrate 11 is 70 to 88°. Incidentally, when a side is curved as illustrated in FIG. 4 or 5, and an angle formed between the side and a transparent substrate is unfixed, a tangential line is drawn from a top edge of a black matrix element to a bottom edge thereof as illustrated in FIG. 4 or 5, and an angle θ formed between the tangential line and the transparent substrate is regarded as the angle formed between the side and the transparent substrate.

Since the angle θ illustrated in FIG. 1 is 77 to 88°, an area of a surface (bottom surface 2d) of the black matrix element 2 coming into contact with the substrate 11 is broader than that of a surface (top surface 2e) opposite to this surface.

The angle θ is preferably narrower, since an ink is fully filled in a corner at which the side 2c of the black matrix element 2 intersects with the surface 11a of the transparent substrate 11. If the angle θ is too narrow, however, the black matrix fails to fully absorb light at the edge portion thereof, which forms the cause of lowering of contrast, and blank areas. In FIG. 1, reference numerals 2a, 2b and 2c are unset portion, set portion and aperture, respectively.

In order to provide the color filter according to the present invention with good yield, in a developing step after exposing a black resist layer to light, the present invention limits a pH value, a temperature and an ejection pressure toward the black resist layer of a developing solution used in the developing step to 10 to 12, 26° C. or lower and 3 MPa or lower, respectively, and controls a time interval between the termination of feed of the developing solution and the initiation of feed of purified rinse water to the substrate to 2 seconds or shorter. In the production process of a color filter according to the present invention, a spin-developing process is preferably adopted.

So far as the pH of the developing solution is within the range of from 10 to 12, etching can be conducted at high speed under a low pressure without impairing the set portion on the surface of the black resist layer. When the pH is controlled to 12 or lower in particular, the influence of side etching can be suppressed. Many of the conventional developing solutions have had a pH lower than 10. However, the pH lower than 10 requires to enhance the physical energy of such a developing solution with a view toward surely removing the unexposed portion. Therefore, it is conducted to apply ultrasonic waves to the developing solution or feed the developing solution under a high pressure from a nozzle to the black resist layer. As a result, the angle θ is made narrower than 70°.

In the present invention, the developing solution is used at a temperature of 26° C. or lower, thereby making it possible to stabilize the etching speed against the resist and moreover inhibit the etching of the unset portion under the set portion due to rise in temperature, i.e., side etching. The inhibition of the side etching also comes to solve the problems that the set portion formed in a reverse-tapered shape by the side etching becomes fragile and chips, and that the chipped set portion becomes dust or particles. The temperature of the developing solution is preferably at least 15° C., more preferably at least 20° C. in order to keep the rate of development at a certain degree.

In the present invention, the ejection pressure of the developing solution toward the black resist layer is limited to 3 MPa or lower, thereby making it possible to inhibit etching against the upper set portion of the photoresist set by the light exposure and etch only the unexposed portion with its rectangular shape retained. The ejection pressure is preferably at least 1 MPa.

The developing solution used in the present invention is preferably a dilute aqueous solution of an inorganic alkali metal hydroxide or alkali metal carbonate such as sodium carbonate, sodium hydroxide or potassium hydroxide, or a dilute aqueous solution of an organic alkali, such as an amine solvent such as triethanolamine or diethanolamine, or a tetraalkylammonium hydroxide (for example, tetramethylammonium hydroxide TMAH). Although the concentration of such an aqueous solution may be suitably preset according to the developing speed, transferability of mask shape in the formation of a pattern, etc., it is preferably of the order of from 0.01% by weight to 30% by weight. The developing solutions usable in the present invention are not limited to those mentioned above, and any developing solution may be used so far as it can dissolve a coating film of a black resist therein and control the end (edge) shape of the black resist according to developing conditions.

In the present invention, a time interval between the termination of feed of the developing solution and the initiation of feed of purified rinse water to the substrate is controlled to 2 seconds or shorter, thereby making it possible to inhibit the progress of side etching at the unset portion of the black resist layer by the developing solution remaining on the patterned substrate after the development to terminate the development with such a portion retained in a rectangular shape. In some cases, the purified rinse water may be fed just after terminating the feed of the developing solution without providing the time interval.

The resinous black matrix of the present invention according to the present invention is preferably formed so as to have an optical density of at least 3 and a thickness of 1.0 to 1.4 $\mu$m.

As the black resist, there may be preferably used that generally comprising an alkali-soluble acrylic resin, a photo-induced polymerization initiator and a pigment for coloring the resulting resist black, and optionally containing a crosslinking agent, an epoxy resin, a solvent for adjusting its viscosity, a filler, a leveling agent and a dispersing agent. The alkali-soluble acrylic resin is such that contains a carboxyl group as a nucleus and has a polymerizable acrylic resin on at least one side chain thereof. As the photo-induced polymerization initiator, there may be used a publicly known initiator disclosed in Japanese Patent Application Laid-Open No. 7-191462, 9-325494 or 10-171119. As the pigment for coloring the resist black, any pigment may be used irrespective of organic or inorganic so far as it is a material exhibiting black and having high light- screening property. Typical examples thereof include carbon black, titanium black, etc. for the inorganics, and such techniques as dyes of red, blue and green colors are mixed to develop a black color, for the organics. However, the pigments are not limited to these pigments.

The resinous black matrix is suitably used in a production process of a color filter using an ink-jet system making good use of its thickness. An embodiment thereof will be described with reference to FIGS. 2A through 2D. FIGS. 2A through 2D are schematic cross-sectional views corresponding to the following Steps a through d, respectively.

Step a

A resinous black matrix 12 is formed on a transparent substrate 11 by the production process of a black matrix according to the present invention. Each element of the black matrix 12 also functions as a partition wall member for preventing color mixing between adjacent inks of different colors.

Step b

Figure 2A:
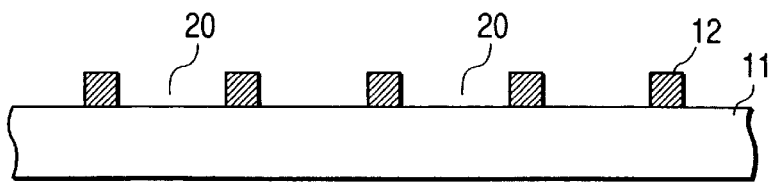
FIGS. 2A, 2B, 2C and 2D are flow charts illustrating an example of the production process of a color filter according to the present invention.
Figure 2B:
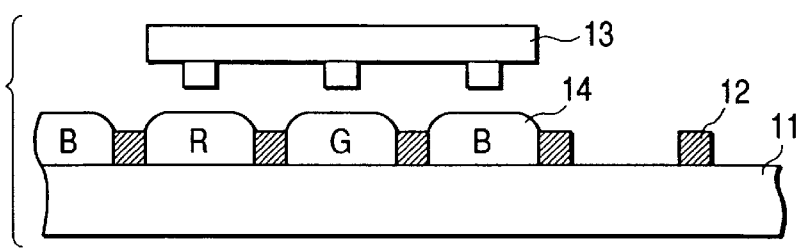
Figure 2C:
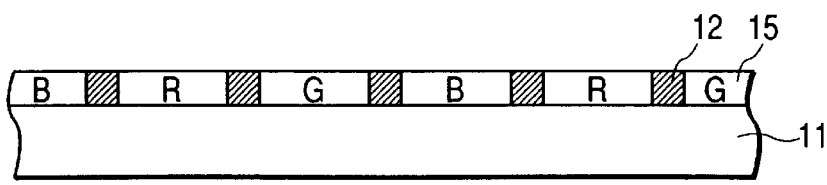
Figure 2D:
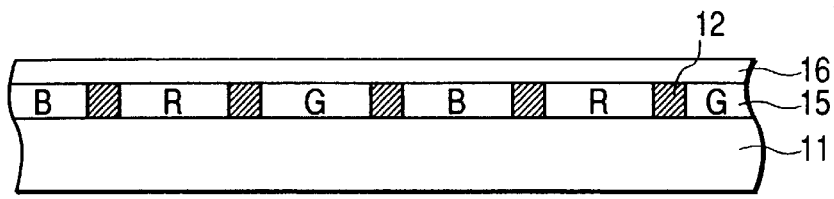

Respective inks 14 of red (R), green (G) and blue (B) colors are applied to the substrate using an ink-jet recording apparatus 13 according to the prescribed coloring pattern in such a manner that apertures 20 shown in FIG. 2A provided in the black matrix 12 are filled.

The inks used in the present invention comprise each a resin composition comprising its corresponding colorant.

As the colorant, general dyes and pigments may be used. Examples of usable dyes include anthraquinone dyes, azo dyes, triphenylmethane dyes and polymethine dyes.

As the resin used in each ink, is used a resin settable by the application of energy, such as heat treatment or light irradiation. Specifically, as a thermosetting resin, a combination of any known resin and a crosslinking agent may be used. Examples thereof include an acrylic resin, a melamine resin or a mixture of a hydroxyl group or carboxyl group- containing polymer and melamine; a mixture of a hydroxyl group or carboxyl group-containing polymer and a polyfunctional epoxy compound; a mixture of a hydroxyl group or carboxyl group-containing polymer and a reactive cellulose compound; a mixture of an epoxy resin and a resol resin; a mixture of an epoxy resin and an amine; a mixture of an epoxy resin and a carboxylic acid or an acid anhydride. As a photosetting resin, any known ones, for example, a commercially available negative-type resist may preferably be used.

Various kinds of solvents may be used in the above-described inks. A mixed solvent of water and at least one water-soluble organic solvent is particularly preferably used from the viewpoint of ejectability in the ink-jet system.

Further, the inks may contain, in addition to the above-described components, surfactants, antifoaming agents, antiseptics and the like as needed to provide them as inks having desired properties. Commercially-available water-soluble dyes and/or the like may also be added thereto.

Of the above-described photo- or thermosetting resins, those insoluble in water or water-soluble organic solvents may also be used with any other solvent than water and water-soluble organic solvents so far as the resulting ink can be stably ejected. In the case where a monomer of the type that polymerization is induced by light in particular is used, a dye is dissolved in the monomer to prepare an ink of the solvent-free type.

As the ink-jet system used in the present invention, a bubble-jet type using an electrothermal converter as an energy-generating element, a piezo-jet type making use of a piezoelectric element, or the like may be used. Ink-applying area and pattern may be optionally preset.

Step c

The inks applied through the apertures 20 provided in the black matrix 12 are set by heat treatment or light irradiation or a combination of both, thereby forming colored portions 15.

Step d

A protective layer 16 is formed as needed. As the protective layer 16, may be used a layer of a resin composition of the photosetting type or thermosetting type or the type set by a combination of heat and light, or an inorganic film formed by vapor deposition, sputtering or the like. In any case, any layer or film may be used so far as it has sufficient transparency for color filter and can withstands subsequent ITO-forming process, alignment film-forming process and the like.

Figure 3:
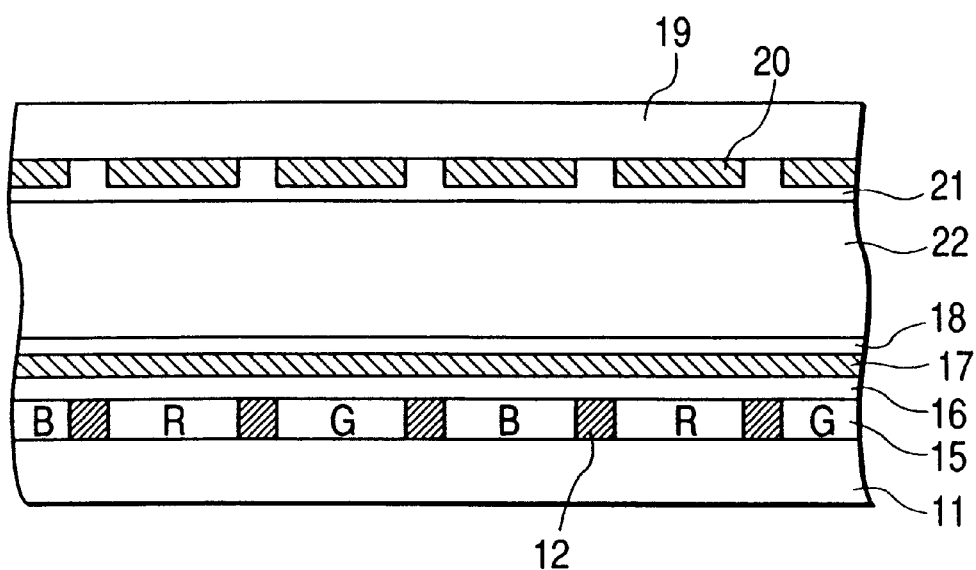
FIG. 3 is a cross-sectional view illustrating an example of a liquid crystal display device according to the present invention.

An active matrix type (the so-called TFT type) color liquid crystal display device using the color filter obtained by the process illustrated in FIGS. 2A through 2D and TFT (thin film transistor) as a switching element is illustrated in FIG. 3. In FIG. 3, reference numeral 17 designate a common electrode, 18 is an alignment film, 19 is an opposite substrate, 20 is pixel electrodes, 21 is an alignment film, and 22 is a liquid crystal compound.

The color liquid crystal display device is generally formed by uniting the color filter and the opposite substrate 19 and enclosing the liquid crystal compound 22 in a space between them. On the inside of one substrate 19 of the liquid crystal display device, TFT (not illustrated) and the transparent pixel electrodes 20 are formed in the form of a matrix. On the inside of the other substrate 11, a color filter layer is provided in such a manner that colored portions 15 of R, G and B colors are arranged at positions opposite to the pixel electrodes 20. The transparent common electrode 17 is formed over the whole surface of the color filter layer. The alignment films 18 and 21 are further formed on the respective insides of both substrates. Liquid crystal molecules can be aligned or oriented in a fixed direction by subjecting these films to a rubbing treatment. These substrates are arranged in an opposing relation to each other through a spacer (not illustrated) and stuck together with a sealant, and the liquid crystal compound 22 is filled in a space between them. Reference numerals 12, 15 and 16 are the same as in FIGS. 2A to 2D.

In the above-described liquid crystal display device, polarizing plates are bonded to the outer surfaces of the respective substrates, and the liquid crystal compound functions as an optical shutter for changing the transmittance of light from a back light generally composed of a combination of a fluorescent lamp and a scattering plate, thereby making a display.

Although the TFT type liquid crystal display device has been described in the above embodiment. However, the present invention is not limited to this type, and is also preferably applied to liquid crystal display devices of other drive types such as the simple matrix type.

In the liquid crystal display devices according to the present invention, the conventional techniques may be applied to other members than a color filter as they are, so far as the devices are fabricated by using the color filter according to the present invention. Accordingly, with respect to the liquid crystal compound also, a commonly used TN type liquid crystal or ferroelectric liquid crystal, or the like may be suitably used.

EXAMPLE 1

"V259-BK739P" (trade name, product of Nippon Steel Chemical Co., Ltd.) was used as a black resist, and a NA35 glass substrate having a size of 200 mm×300 mm×0.7 mm was used as a substrate.

After the glass substrate was subjected to ultrasonic cleaning with warm purified water and dried, the black resist was applied onto the glass substrate by a spin coater. The spin coating was conducted for 30 seconds under conditions of 600 rpm. The film thickness of the resultant black resist layer was 1.2 $\mu$m. After the spin coating, the black resist layer was dried and prebaked for 180 seconds on a hot plate heated to 70° C., and then subjected to light exposure through a negative mask for a resinous black matrix. The exposure was conducted for 10 seconds by means of an aligner manufactured by Dainippon Screen Mfg. Co., Ltd. under conditions of an intensity of irradiation of 14 mW and a proximity gap of 50±1 $\mu$m. The pattern of the negative mask used was such that a pitch and a line width in a longitudinal direction were 220 $\mu$m and 30 $\mu$m, respectively, and a pitch and a line width in a lateral direction were 80 $\mu$m and 10 $\mu$m, respectively.

The substrate subjected to the exposure under the above-described conditions was developed. A developing solution used was 0.01N sodium carbonate. The pH of the developing solution at this time was 10.5. A developer used was of a spin developing system. This is an apparatus of the system that a substrate is rotated, a developing solution is ejected under pressure to the rotating substrate through nozzles from the above, and the substrate is rinsed with purified water just after completion of the development or etching. The developing conditions were such that the developing solution controlled to a temperature of 25° C. was fed under a feeding pressure of 3 MPa/cm$^2$ from a developing solution feeding arm equipped with 5 flat cone nozzles and ejected from the nozzles for developing solution in a state rotated at 1,000 rpm to apply it for 8 seconds to the exposed resist. After 2 seconds from the termination of feed of the developing solution, purified water was fed for 30 seconds to the developed substrate under rotation from nozzles for rinsing.

The number of revolutions of the substrate was increased to 2,000 rpm to dry the substrate for 60 seconds by shaking off the rinse water, and then post-baked at 200° C. for 50 minutes in a clean oven to obtain a pattern of a resinous black matrix. The sectional form of the resinous black matrix thus obtained was such that an angle formed between the glass substrate and a side of each element of the black matrix was 80° as measured by means of AFM (atomic force microscope).

EXAMPLE 2

"CK-S171" (trade name, product of Tokyo Ohka Kogyo Co., Ltd.) was used as a black resist, and the same glass substrate as that used in EXAMPLE 1 was used as a transparent substrate.

After the glass substrate was subjected to ultrasonic cleaning with warm purified water and dried, the black resist was applied onto the glass substrate by a spin coater. The spin coating was conducted for 45 seconds under conditions of 750 rpm. The film thickness of the resultant black resist layer was 1.0 $\mu$m. After the spin coating, the black resist layer was dried and prebaked for 180 seconds on a hot plate heated to 90° C., and then subjected to light exposure through a negative mask for a resinous black matrix. The aligner and negative mask used in the exposure were the same as those used in EXAMPLE 1. The exposure was conducted for 25 seconds under the same conditions as in EXAMPLE 1.

The substrate subjected to the exposure under the above-described conditions was developed. A developing solution used was 0.1N sodium carbonate. The pH of this developing solution was 11.5. A developer used was of the same spin developing system as in EXAMPLE 1. The developing conditions were such that the developing solution controlled to a temperature of 25° C. was fed under a feeding pressure of 3 MPa/cm$^2$ from a developing solution feeding arm equipped with 5 flat cone nozzles and ejected from the nozzles for developing solution in a state rotated at 1,000 rpm to apply it for 5 seconds to the exposed resist. After 2 seconds from the termination of feed of the developing solution, purified water of high pressure (35 MPa/cm$^2$) was fed for 30 seconds to the developed substrate under rotation from nozzles for rinsing.

After terminating the feed of purified water, the number of revolutions of the substrate was increased to 2,000 rpm to dry the substrate for 60 seconds by shaking off the rinse water, and then post-baked at 200° C. for 50 minutes in a clean oven to obtain a pattern of a resinous black matrix. The sectional form of the resinous black matrix thus obtained was such that an angle formed between the glass substrate and a side of each element of the black matrix was 84° as measured by means of AFM.

EXAMPLE 3

The same black resist and glass substrate as those used in EXAMPLE 1 were used to obtain a substrate subjected to light exposure in accordance with the same process as in EXAMPLE 1.

The exposed substrate thus obtained was developed. A developing solution used was 0.01N sodium carbonate. The pH of this developing solution was 10.5. A developer used was of the same spin developing system as in EXAMPLE 1. The developing conditions were such that the developing solution controlled to a temperature of 20° C. was fed under a feeding pressure of 3 MPa/cm$^2$ from a developing solution feeding arm equipped with 5 flat cone nozzles and ejected from the nozzles for developing solution in a state rotated at 1,000 rpm to apply it for 10 seconds to the exposed resist. After 2 seconds from the termination of feed of the developing solution, purified water was fed for 30 seconds to the developed substrate under rotation from nozzles for rinsing.

After terminating the feed of purified water, the number of revolutions of the substrate was increased to 2,000 rpm to dry the substrate for 60 seconds by shaking off the rinse water, and then post-baked at 200° C. for 50 minutes in a clean oven to obtain a pattern of a resinous black matrix. The sectional form of the resinous black matrix thus obtained was such that an angle formed between the glass substrate and a side of each element of the black matrix was 75° as measured by means of AFM.

EXAMPLE 4

The same black resist and glass substrate as those used in EXAMPLE 1 were used to obtain a substrate subjected to light exposure in accordance with the same process as in EXAMPLE 1.

The exposed substrate thus obtained was developed. A developing solution used was 0.01N sodium carbonate. The pH of this developing solution was 10.5. A developer used was of the same spin developing system as in EXAMPLE 1. The developing conditions were such that the developing solution controlled to a temperature of 26° C. was fed under a feeding pressure of 3 MPa/cm$^2$ from a developing solution feeding arm equipped with 5 flat cone nozzles and ejected from the nozzles for developing solution in a state rotated at 1,000 rpm to apply it for 7 seconds to the exposed resist. After 2 seconds from the termination of feed of the developing solution, purified water was fed for 30 seconds to the developed substrate under rotation from nozzles for rinsing.

After terminating the feed of purified water, the number of revolutions of the substrate was increased to 2,000 rpm to dry the substrate for 60 seconds by shaking off the rinse water, and then post-baked at 200° C. for 50 minutes in a clean oven to obtain a pattern of a resinous black matrix. The sectional form of the resinous black matrix thus obtained was such that an angle formed between the glass substrate and a side of each element of the black matrix was 88° as measured by means of AFM.

EXAMPLE 5

"BK-729S" (trade name, product of Tokyo Ohka Kogyo Co., Ltd.) was used as a black resist, and the same glass substrate as that used in EXAMPLE 1 was used to obtain a substrate subjected to light exposure in accordance with the same process as in EXAMPLE 1.

The exposed substrate thus obtained was developed. A developing solution used was 0.01N sodium carbonate. The pH of this developing solution was 10.5. A developer used was of the same spin developing system as in EXAMPLE 1. The developing conditions were such that the developing solution controlled to a temperature of 20° C. was fed under a feeding pressure of 1 MPa/cm$^2$ from a developing solution feeding arm equipped with 5 flat cone nozzles and ejected from the nozzles for developing solution in a state rotated at 1,000 rpm to apply it for 12 seconds to the exposed resist. After 2 seconds from the termination of feed of the developing solution, purified water was fed for 30 seconds to the developed substrate under rotation from nozzles for rinsing.

After terminating the feed of purified water, the number of revolutions of the substrate was increased to 2,000 rpm to dry the substrate for 60 seconds by shaking off the rinse water, and then post-baked at 200° C. for 50 minutes in a clean oven to obtain a pattern of a resinous black matrix. The sectional form of the resinous black matrix thus obtained was such that an angle formed between the glass substrate and a side of each element of the black matrix was 70° as measured by means of AFM.

COMPARATIVE EXAMPLE 1

The same black resist and glass substrate as those used in EXAMPLE 1 were used to obtain a substrate subjected to light exposure in accordance with the same process as in EXAMPLE 1.

The exposed substrate thus obtained was developed. A developing solution used was 0.001N sodium carbonate the pH of which was 9. A developer used was of the same spin developing system as in EXAMPLE 1. The developing conditions were such that the developing solution controlled to a temperature of 25° C. was fed under a feeding pressure of 3 MPa/cm$^2$ from a developing solution feeding arm equipped with 5 flat cone nozzles and ejected from the nozzles for developing solution in a state rotated at 1,000 rpm to apply it for 16 seconds to the exposed resist. After 2 seconds from the termination of feed of the developing solution, purified water was fed for 30 seconds to the developed substrate under rotation from nozzles for rinsing.

After terminating the feed of purified water, the number of revolutions of the substrate was increased to 2,000 rpm to dry the substrate for 60 seconds by shaking off the rinse water, and then post-baked at 200° C. for 50 minutes in a clean oven to obtain a pattern of a resinous black matrix. The sectional form of the resinous black matrix thus obtained was such that an angle formed between the glass substrate and a side of each element of the black matrix was 67° as measured by means of AFM. This was attributable to the fact that the unexposed portion was unable to be fully removed due to the too low pH of the developing solution.

COMPARATIVE EXAMPLE 2

The same black resist as that used in EXAMPLE 5 and the same glass substrate as that used in EXAMPLE 1 were used to obtain a substrate subjected to light exposure in accordance with the same process as in EXAMPLE 1.

The exposed substrate thus obtained was developed. A developing solution used was 0.32N sodium carbonate the pH of which was 13.5. A developer used was of the same spin developing system as in EXAMPLE 1. The developing conditions were such that the developing solution controlled to a temperature of 20° C. was fed under a feeding pressure of 3 MPa/cm$^2$ from a developing solution feeding arm equipped with 5 flat cone nozzles and ejected from the nozzles for developing solution in a state rotated at 1,000 rpm to apply it for 6 seconds to the exposed resist. After 2 seconds from the termination of feed of the developing solution, purified water was fed for 30 seconds to the developed substrate under rotation from nozzles for rinsing.

After terminating the feed of purified water, the number of revolutions of the substrate was increased to 2,000 rpm to dry the substrate for 60 seconds by shaking off the rinse water, and then post-baked at 200° C. for 50 minutes in a clean oven to obtain a pattern of a resinous black matrix. The observation of the sectional form of the resinous black matrix thus obtained through a microscope revealed that its edge portion became translucent. When a focus point was moved for confirmation, it was found that side etching occurred. Accordingly, an angle formed between the glass substrate and a side of each element of the black matrix was not narrower than 90°. The occurrence of the side etching was attributable to the fact that the pH of the developing solution was too high.

COMPARATIVE EXAMPLE 3

The same black resist and glass substrate as those used in EXAMPLE 1 were used to obtain a substrate subjected to light exposure in accordance with the same process as in EXAMPLE 1.

The exposed substrate thus obtained was developed. A developing solution used was 0.01N sodium carbonate the pH of which was 10.5. A developer used was of the same spin developing system as in EXAMPLE 1. The developing conditions were such that the developing solution controlled to a temperature of 27° C. was fed under a feeding pressure of 3 MPa/cm$^2$ from a developing solution feeding arm equipped with 5 flat cone nozzles and ejected from the nozzles for developing solution in a state rotated at 1,000 rpm to apply it for 6.5 seconds to the exposed resist. After 2 seconds from the termination of feed of the developing solution, purified water was fed for 30 seconds to the developed substrate under rotation from nozzles for rinsing.

After terminating the feed of purified water, the number of revolutions of the substrate was increased to 2,000 rpm to dry the substrate for 60 seconds by shaking off the rinse water, and then post-baked at 200° C. for 50 minutes in a clean oven to obtain a pattern of a resinous black matrix. The observation of the sectional form of the resinous black matrix thus obtained through a microscope revealed that its edge portion became translucent. When a focus point was moved for confirmation, it was found that side etching occurred. Accordingly, an angle formed between the glass substrate and a side of each element of the black matrix was not narrower than 90°. The occurrence of the side etching was attributable to the fact that the temperature of the developing solution was too high.

COMPARATIVE EXAMPLE 4

The same black resist as that used in EXAMPLE 5 and the same glass substrate as that used in EXAMPLE 1 were used to obtain a substrate subjected to light exposure in accordance with the same process as in EXAMPLE 1.

The exposed substrate thus obtained was developed. A developing solution used was 0.01N sodium carbonate the pH of which was 10.5. A developer used was of the same spin developing system as in EXAMPLE 1. In this developer, the feed of cooling water for controlling the temperature of the developing solution was forcedly stopped to leave the developer to stand for 30 minutes. As a result, the temperature of the developing solution was raised to 32° C. by heat of a motor for stirring and circulation. The developing conditions were such that the developing solution raised to the temperature of 32° C. was fed under a feeding pressure of 3 MPa/cm$^2$ from a developing solution feeding arm equipped with 5 flat cone nozzles and ejected from the nozzles for developing solution in a state rotated at 1,000 rpm to apply it for 5 seconds to the exposed resist. After 2 seconds from the termination of feed of the developing solution, purified water was fed for 30 seconds to the developed substrate under rotation from nozzles for rinsing.

After terminating the feed of purified water, the number of revolutions of the substrate was increased to 2,000 rpm to dry the substrate for 60 seconds by shaking off the rinse water, and then post-baked at 200° C. for 50 minutes in a clean oven to obtain a pattern of a resinous black matrix. The sectional form of the resinous black matrix thus obtained was such that an angle formed between the glass substrate and a side of each element of the black matrix was 65° as measured by means of AFM. This was attributable to the fact that side etching occurred due to the too high temperature of the developing solution, and the upper set portion of the black resist, which was formed in a reverse-tapered shape by the side etching and became fragile, chipped.

COMPARATIVE EXAMPLE 5

The same black resist and glass substrate as those used in EXAMPLE 1 were used to obtain a substrate subjected to light exposure in accordance with the same process as in EXAMPLE 1.

The exposed substrate thus obtained was developed. A developing solution used was 0.01N sodium carbonate the pH of which was 10.5. A developer used was of the same spin developing system as in EXAMPLE 1. The developing conditions were such that the developing solution controlled to a temperature of 20° C. was fed under a feeding pressure of 4 MPa/cm$^2$ from a developing solution feeding arm equipped with 5 flat cone nozzles and ejected from the nozzles for developing solution in a state rotated at 1,000 rpm to apply it for 7 seconds to the exposed resist. After 2 seconds from the termination of feed of the developing solution, purified water was fed for 30 seconds to the developed substrate under rotation from nozzles for rinsing.

After terminating the feed of purified water, the number of revolutions of the substrate was increased to 2,000 rpm to dry the substrate for 60 seconds by shaking off the rinse water, and then post-baked at 200° C. for 50 minutes in a clean oven to obtain a pattern of a resinous black matrix. The sectional form of the resinous black matrix thus obtained was such that an angle formed between the glass substrate and a side of each element of the black matrix was 60° as measured by means of AFM. This was attributable to the fact that the edge portion of the upper set portion of the black resist was physically scraped off due to the too high ejection pressure of the developing solution.

COMPARATIVE EXAMPLE 6

The same black resist and glass substrate as those used in EXAMPLE 1 were used to obtain a substrate subjected to light exposure in accordance with the same process as in EXAMPLE 1.

The exposed substrate thus obtained was developed. A developing solution used was 0.01N sodium carbonate the pH of which was 10.5. A developer used was of the same spin developing system as in EXAMPLE 1. The developing conditions were such that the developing solution controlled to a temperature of 20° C. was fed under a feeding pressure of 3 MPa/cm$^2$ from a developing solution feeding arm equipped with 5 flat cone nozzles and ejected from the nozzles for developing solution in a state rotated at 1,000 rpm to apply it for 10 seconds to the exposed resist. After 3 seconds from the termination of feed of the developing solution, purified water was fed for 30 seconds to the developed substrate under rotation from nozzles for rinsing.

After terminating the feed of purified water, the number of revolutions of the substrate was increased to 2,000 rpm to dry the substrate for 60 seconds by shaking off the rinse water, and then post-baked at 200° C. for 50 minutes in a clean oven to obtain a pattern of a resinous black matrix. The observation of the sectional form of the resinous black matrix thus obtained through a microscope revealed that its edge portion became translucent. When a focus point was moved for confirmation, it was found that side etching occurred. Accordingly, an angle formed between the glass substrate and a side of each element of the black matrix was not narrower than 90°. The occurrence of the side etching was attributable to the fact that the etching was allowed to further proceed by the developing solution remaining on the substrate because the time interval between the termination of feed of the developing solution and the feed of the purified water was too long.

The black matrices obtained in the above examples and comparative examples were respectively used to form color filters in accordance with the steps illustrated in FIGS. 2A to 2D. Inks used were each obtained by dispersing a dye of R, G or B color in a self-crosslinking thermosetting resin comprising an acrylic-silicone graft copolymer as a main component, and dissolving this dispersion in a solvent (for example, isopropyl alcohol, ethylene glycol or N-methyl-2-pyrrolidone). The inks evenly covered the surface of the substrate corresponding to the apertures provided in each black matrix, and defective results such as bleeding, runout and color mixing between inks present in adjacent apertures were not observed. After the inks were subjected to a heat treatment to set them, a protective layer was applied thereto, and a transparent conductive film was further formed thereon. Even in this case, no inconvenience arose due to excellent adhesion.

With respect to each of the black matrices obtained in the respective examples and comparative examples, the angle formed between the glass substrate and the side of each element of the black matrix, and the presence of defective blank area and yield upon mass production in the color filter obtained by using the black matrix are shown in Table 1. In the table, A, B and C as to "Presence of defective blank area" mean that no defective blank area was present, that some defective blank areas were present, and that many defective blank areas were present, and such a color filter was unacceptable as a product, respectively, while A and C as to "Yield upon mass production" mean that at least 80% of products were acceptable, and that lower than 80% of products were acceptable, respectively.

TABLE 1

|   | Angle (°) of glass substrate with side of black matrix | Presence of defective blank area | Yield upon mass production |
| --- | --- | --- | --- |
| Ex. 1 | 80 | A | A |
| Ex. 2 | 84 | A | A |
| Ex. 3 | 75 | A | A |
| Ex. 4 | 88 | A | A |
| Ex. 5 | 70 | A | A |
| Comp. Ex. 1 | 67 | B | C |
| Comp. Ex. 2 | >90 | A | C |
| Comp. Ex. 3 | >90 | A | C |
| Comp. Ex. 4 | 65 | C | C |
| Comp. Ex. 5 | 60 | C | C |
| Comp. Ex. 6 | >90 | A | C |

According to the present invention, there can be provided color filters free of defects such as blank areas and excellent in mass productivity. Further, liquid crystal display devices, which permit excellent color display and high contrast, can be provided by using such a color filter.

What is claimed is:

1. A color filter, comprising a substrate, a resinous black matrix and colored portions provided between elements of the resinous black matrix, wherein the colored portions are provided directly on the substrate and an angle formed between a side of each element of the resinous black matrix and the substrate is 70 to 88°.

2. The color filter according to claim 1, wherein the thickness of the black matrix is 1.0 to 1.4 µm.

3. A liquid crystal display device, comprising the color filter according to claims 1 or 2, an opposite substrate arranged in an opposing relation to the color filter, and a liquid crystal enclosed in a space between the color filter and the opposite substrate.

4. A process for producing a black matrix, comprising the steps of:

applying a black resist onto a substrate;

subjecting the black resist to patterning exposure;

developing the exposed black resist and subjecting the developed black resist to a rinsing treatment;

wherein a pH value, a temperature and an ejection pressure of a developing solution used in the developing step are 10 to 12, 26° C. or lower and 3 MPa or lower, respectively, and a time interval between the termination of feed of the developing solution and the initiation of the rinsing treatment is 2 seconds or shorter.

5. The production process according to claim 4, wherein the temperature of the developing solution is at least 15° C.

6. The production process according to claim 5, wherein the temperature of the developing solution is at least 20° C.

7. The production process according to claim 4, wherein the ejection pressure of the developing solution is at least 1 MPa.

8. A process for producing a color filter, comprising the step of applying inks by an ink-jet system to respective regions between elements of the black matrix formed by the production process according to claim 4, thereby forming colored portions.

9. A color filter, comprising a substrate, a resinous black matrix and colored portions provided between elements of the resinous black matrix, wherein an angle formed between a side of each element of the resinous black matrix and the substrate is 70 to 88°, and said colored portions are colored by applying ink between the elements of the resinous black matrix.

10. A color filter according to claim 9, wherein the thickness of the black matrix is 1.0 to 1.4 µm.

11. A liquid crystal device, comprising the color filter according to claims 9 or 10, an opposite substrate arranged in an opposing relation to the color filter, and a liquid crystal enclosed is a space between the color filter and the opposite substrate.

* * * * *

UNITED STATES PATENT AND TRADEMARK OFFICE
CERTIFICATE OF CORRECTION

PATENT NO.    : 6,183,917 B1
DATED         : February 6, 2001
INVENTOR(S)   : Junichi Sakamoto et al.

It is certified that error appears in the above-identified patent and that said Letters Patent is hereby corrected as shown below:

Title page,
Item [56] U.S. FOREIGN PATENT DOCUMENTS
"248412     9/1995  (JP) (first occurrence) should be deleted.

Column 1,
Line 11, "automobile," should read -- automobiles, --;
Line 15, "black" should read -- a black --;
Line 31, "metal and metal compound" should read -- a metal and metal compounds --;
Line 35, "has"should read -- does --;
Line 37, "involved" should read -- involves --;

Column 2,
Line 17, "weakened" should read -- is weakened --;
Line 39, "form" should read -- be formed --;
Line 48, "for" should read -- for the --;

Column 4,
Line 5, "unset" should read -- an unset --;
Line 6, "set portion and" should read -- a set portion and an --;
Line 62, "mask" should read -- the mask --;

Column 5,
Line 32, "light- screening" should read -- light-screening --;
Line 43, "Steps" should read -- steps --.

Column 6,
Line 31, "Ink-applying" should read -- The ink-applying --;
Line 45, "withstands" should read -- withstand the --;
Line 52, "designate" should read -- designates --.

Column 7,
Line 17, "embodiment. However," should read -- embodiment, however, --;
Line 23, "than" should read -- other than --.

Column 13,
Line 12, "Inks" should read -- The inks --;
Line 29, "of" (second occurrence) should read -- of the --.

UNITED STATES PATENT AND TRADEMARK OFFICE
CERTIFICATE OF CORRECTION

PATENT NO. : 6,183,917, B1
DATED : February 6, 2001
INVENTOR(S) : Junichi Sakamoto et al.

It is certified that error appears in the above-identified patent and that said Letters Patent is hereby corrected as shown below:

Column 14,
Line 23, "resist and subjecting" should read -- resist; and ¶ subjecting --.

Signed and Sealed this

Twenty-sixth Day of March, 2002

Attest:

JAMES E. ROGAN
Attesting Officer     Director of the United States Patent and Trademark Office